United States Patent
Miyashita et al.

(10) Patent No.: US 8,098,092 B2
(45) Date of Patent: Jan. 17, 2012

(54) POWER AMPLIFIER

(75) Inventors: Takumi Miyashita, Kawasaki (JP);
Takeshi Takano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/782,417

(22) Filed: May 18, 2010

(65) Prior Publication Data

US 2010/0225388 A1 Sep. 9, 2010

Related U.S. Application Data

(63) Continuation of application No. PCT/JP2007/001277, filed on Nov. 21, 2007.

(51) Int. Cl.
*H03F 3/68* (2006.01)

(52) U.S. Cl. ............ 330/124 R; 330/295; 330/136

(58) Field of Classification Search ............ 330/124 R, 330/295, 136
See application file for complete search history.

(56) References Cited

U.S. PATENT DOCUMENTS

| | | | | |
|---|---|---|---|---|
| 6,137,355 A * | 10/2000 | Sevic et al. | | 330/51 |
| 6,639,464 B2 * | 10/2003 | Hellberg | | 330/124 R |
| 7,129,778 B2 * | 10/2006 | Robinson | | 330/151 |
| 7,295,064 B2 * | 11/2007 | Shiikuma et al. | | 330/124 R |
| 7,427,895 B1 * | 9/2008 | Okubo et al. | | 330/124 R |
| 7,649,412 B2 * | 1/2010 | Horiguchi et al. | | 330/124 R |
| 2003/0076167 A1 | 4/2003 | Hellberg | | |
| 2003/0137346 A1 * | 7/2003 | Hellberg | | 330/124 R |
| 2004/0051583 A1 | 3/2004 | Hellberg | | |

FOREIGN PATENT DOCUMENTS

| | | |
|---|---|---|
| JP | 47-041815 A | 12/1972 |
| JP | 2003-536313 A | 12/2003 |
| JP | 2004-503160 A | 1/2004 |
| JP | 2004-503161 A | 1/2004 |
| JP | 2006-148780 A | 6/2006 |

OTHER PUBLICATIONS

International Search Report issued in PCT/JP2007/001277, dated Feb. 21, 2008.

* cited by examiner

*Primary Examiner* — Patricia Nguyen
(74) *Attorney, Agent, or Firm* — Murphy & King, P.C.

(57) ABSTRACT

A Doherty amplifier is provided with a clipping circuit for making signal power flow to ground if the signal power becomes equal to or higher than a predetermine value in order to prevent a carrier amplifier, which is a small amplifier, from being destroyed if the signal power is increased to a sevenfold to tenfold multiple of a ratio of the size of the carrier amplifier to that of a peak amplifier.

12 Claims, 17 Drawing Sheets

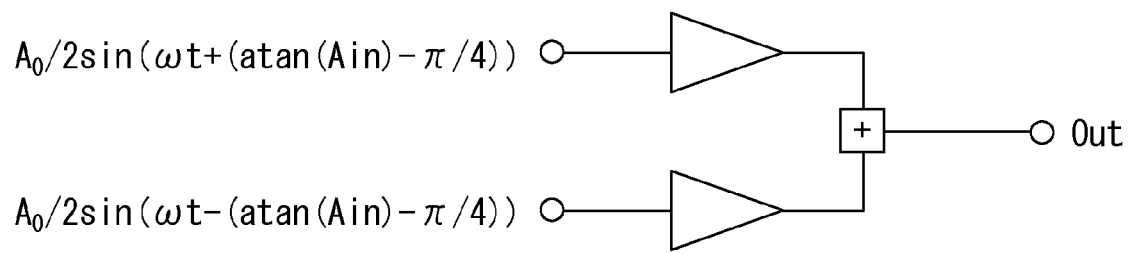
F I G. 1 A

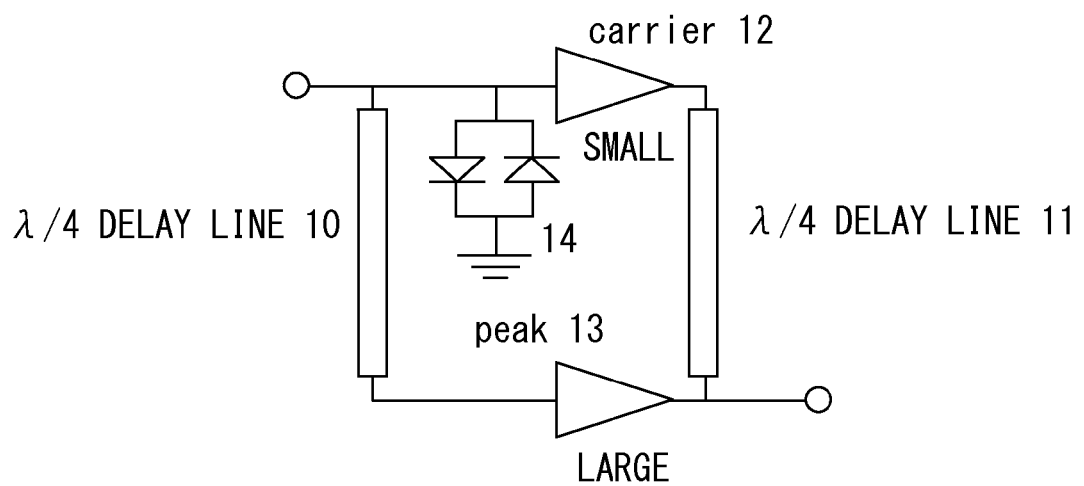
F I G. 2

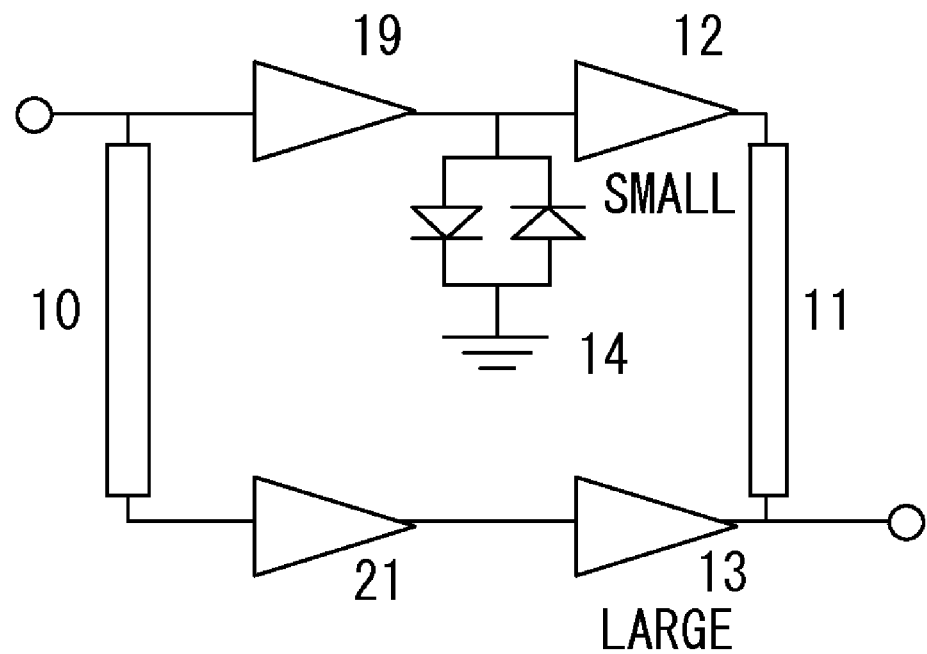
F I G. 7

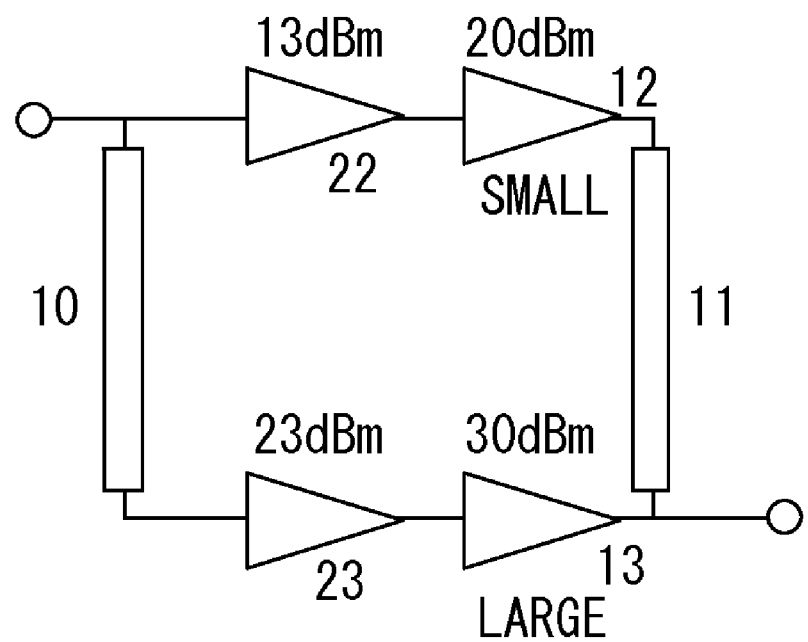
F I G. 8

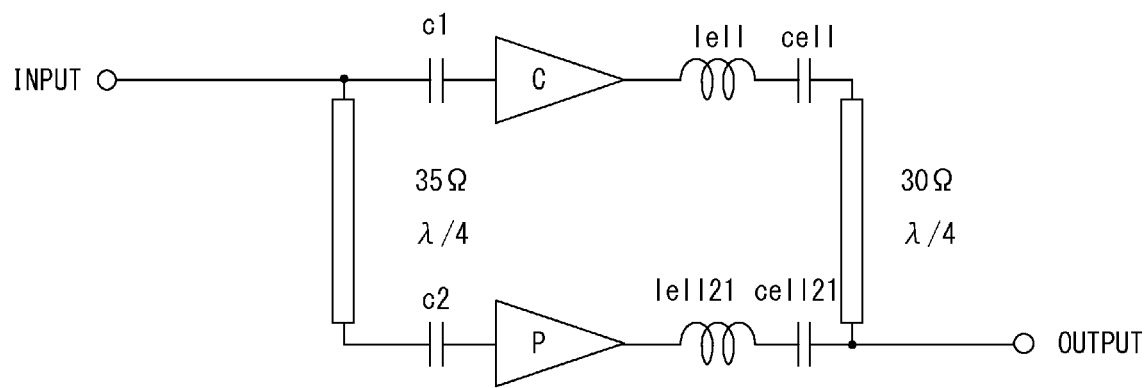
F I G. 9

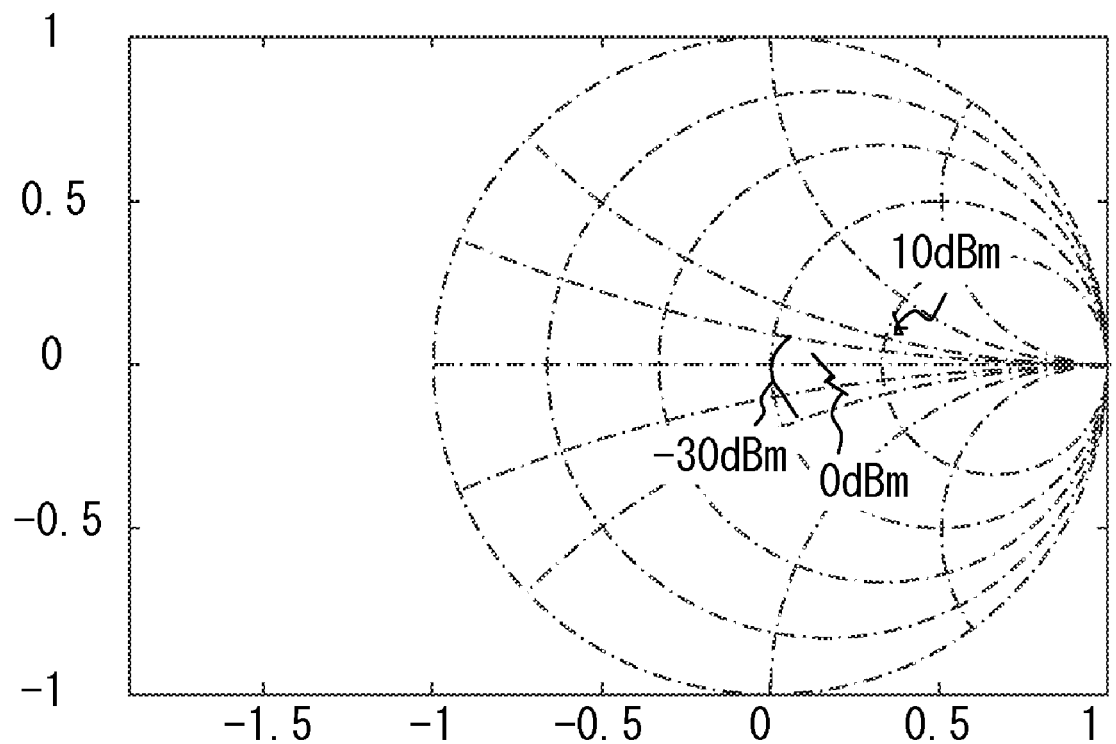
F I G. 1 0 A

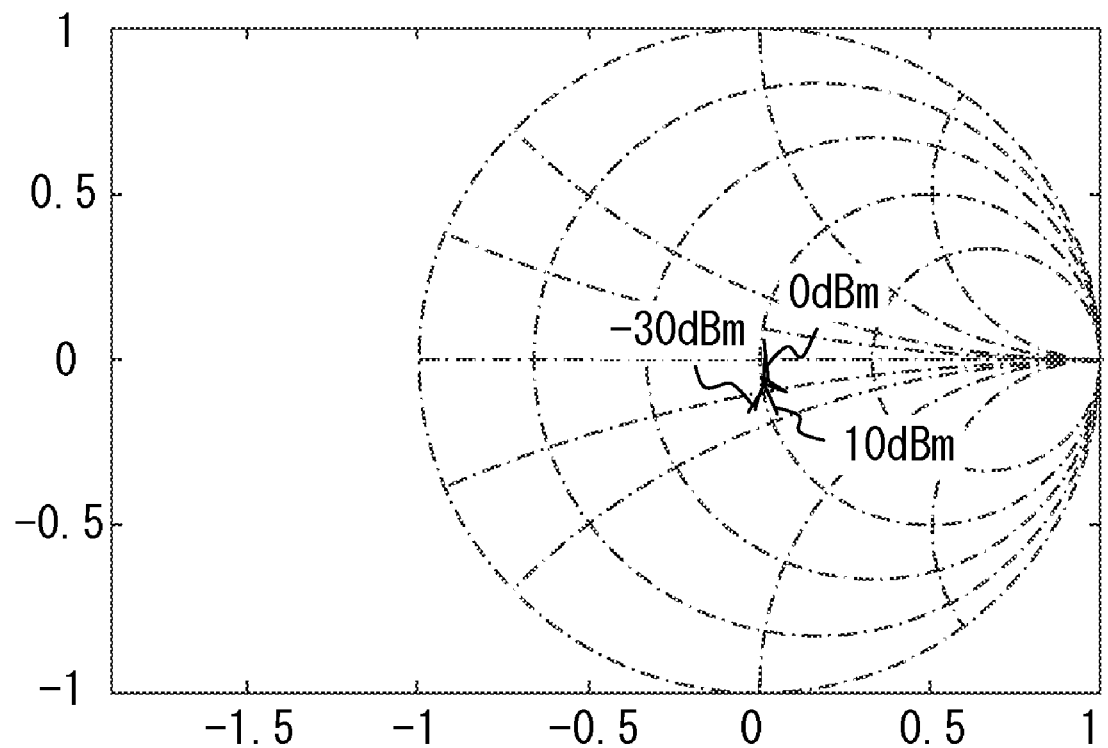
F I G. 1 0 B

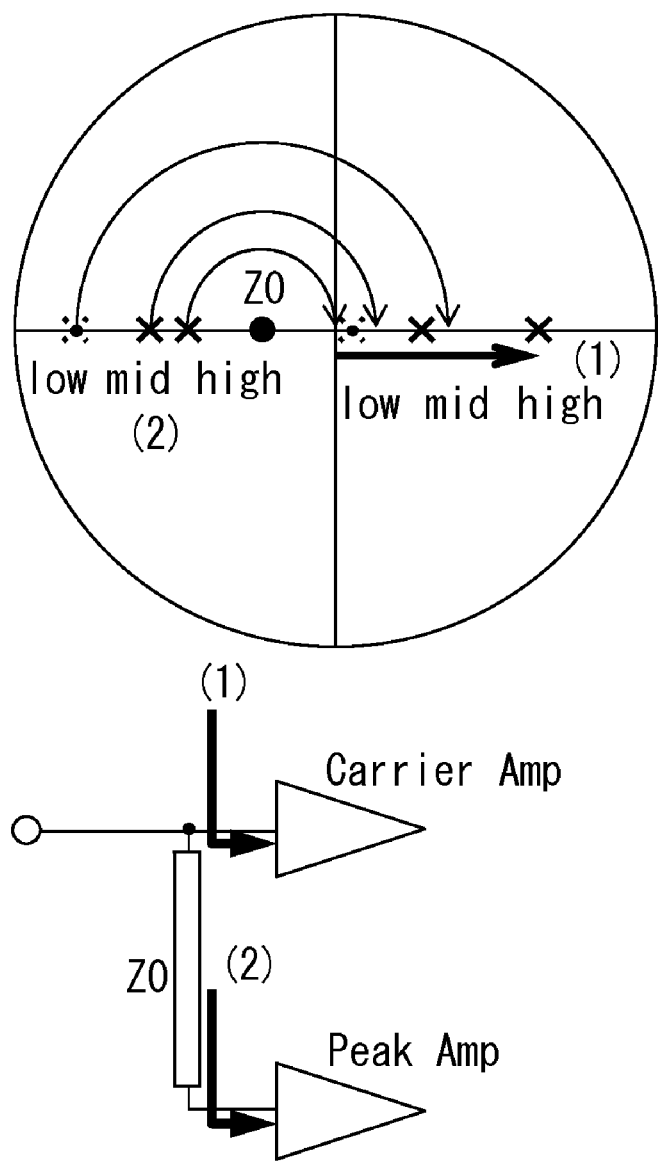
F I G. 1 2

POWER AMPLIFIER

CROSS REFERENCE TO RELATED APPLICATION

This application is a continuation of PCT application PCT/JP2007/001277 which was filed on Nov. 21, 2007.

FIELD

The present invention relates to a power amplifier.

BACKGROUND

In recent years, broadband wireless systems have been put into practical use. These modulation/demodulation systems adopt a multi-carrier (OFDM or the like) method using many carrier waves in order to implement systems having a high frequency use rate.

In this case, an amplitude of a transmission signal instantaneously becomes very large. Since a power amplifier normally causes a linear distortion, its output signal is distorted. To make the distortion fall within a tolerable range, a power amplifier having a high peak output power needs to be used. Namely, a large back-off needs to be secured in order to maintain linearity, leading to a decrease in power efficiency. This is very inconvenient, especially for mobile terminals (the duration of a call becomes very short). Accordingly, it is desired to realize a power amplifier having an efficiency that does not decrease within a power level ranging from peak power to a relatively low power (within a wide dynamic range).

An effective method for operating a power amplifier using a semiconductor element at a high power supply efficiency is to reduce a loss caused within the element. Accordingly, the power amplifier normally needs to be operated so that a time integration of a product of a current and a voltage at an output terminal where an internal loss is caused within the element becomes small. To implement this, a saturation operation is effective. Some methods for efficiently extracting a wave having a modulated amplitude from an amplification element that is continuously performing a saturation operation have been developed and are widely known. The purpose of the saturation operation is to amplify a signal over an entire dynamic range of an amplifier. Since the entire dynamic range is used, a signal is amplified by using an entire operable range of an amplifier. This leads to an increase in power efficiency.

Representative circuits include LINC (Linear Amplification Using Nonlinear Components), a Doherty amplifier, envelope tracking (ET), and envelope elimination and restoration (EER). These circuits are summarized below.

FIGS. 1A to 1C respectively illustrate configurations of the representative amplifiers of the conventional techniques.

1. LINC (FIG. 1A): Two amplifiers are made to perform a saturation operation by being driven at a constant and large amplitude, and output powers are synthesized and output. The amplitude of each of the outputs is varied by changing a phase of each of the inputs.

2. Doherty amplifier (FIG. 1B): Two amplifiers, such as a main amplifier and an auxiliary amplifier, are included. A signal that is delayed by λ/4 from an input of the main amplifier is input to the auxiliary amplifier, and an output of the main amplifier is delayed by λ/4 and synthesized with an output of the auxiliary amplifier. Normally, the main amplifier is operated in class A to AB, whereas the auxiliary amplifier is operated in class B. If input power is increased, the main amplifier starts a saturation operation earlier, and achieves a high efficiency.

3. ET, EER (FIG. 1C): A power supply voltage is varied while causing the amplifier to perform a saturation operation, and a signal having a modulated amplitude is obtained as an output.

However, the above described conventional techniques have the following problems.

1. LINC: It is difficult to efficiently synthesize the outputs of the two amplifiers.

2. Doherty amplifier: A linear circuit having a small loss is used as a power matching circuit of the input/output of each of the amplifiers and as a power synthesizer of the outputs. Therefore, input/output impedances of the amplifiers and a phase/amplitude transfer characteristic from the input to the output change depending on the size of a signal. In particular, this change becomes significant if a bias current is reduced to increase efficiency in the case of low power. The linear power matching circuit and the power synthesizer of the outputs cannot cope with the change in the input/output impedance and the phase/amplitude transfer characteristic from the input to the output, and efficiency decreases if signal power varies. Moreover, a small amplifier that quickly achieves a high efficiency by being saturated at a low output power level in a wide power range where the amplifier operates and a large amplifier capable of outputting a high power are combined and used. If the sizes of elements used for the large and the small amplifiers are significantly different, it is possible that the elements of the small amplifier will be destroyed if power input to the large and the small amplifiers is the same.

SUMMARY

A power amplifier of a Doherty type in a first aspect of the present invention includes: a first amplifier; a second amplifier that is connected in parallel to the first amplifier, and outputs lower power than the first amplifier; and clipping unit that is provided on an input side of the second amplifier and is configured to clip an input signal if an amplitude of the input signal to the second amplifier is equal to or larger than a predetermined value.

A power amplifier of a Doherty type in a second aspect of the present invention includes: a first amplifier an input impedance of which is equal to an impedance of a signal source if an amplitude of a signal is small, and an impedance of which increases with an increase in the amplitude of the signal; and a second amplifier an input impedance of which is equal to an impedance of a signal source, and which is connected in parallel to the first amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed

BRIEF DESCRIPTION OF DRAWINGS

FIG. 1A is a circuit diagram (No. 1) illustrating a configuration of a representative power amplifier of a conventional technique;

FIG. 2 illustrates a fundamental configuration of an embodiment of the present invention;

FIG. 7 is a circuit diagram (No. 4) illustrating a still further embodiment;

FIG. 8 is a circuit diagram (No. 5) illustrating a still further embodiment;

FIG. 9 is a schematic (No. 1) for explaining operations of the configuration illustrated in FIG. 8;

FIG. 10A is a schematic (No. 2) for explaining the operations of the configuration illustrated in FIG. 8;

FIG. 10B is a schematic (No. 3) for explaining the operations of the configuration illustrated in FIG. 8;

FIG. 12 is a schematic (No. 6) for explaining the operations of the configuration illustrated in FIG. 8.

DESCRIPTION OF EMBODIMENTS

FIG. 2 illustrates a fundamental configuration of an embodiment of the present invention.

In a Doherty amplifier, if a ratio of the magnitude of output power of a carrier (main) amplifier to that of a peak (auxiliary) amplifier is set to a several-fold (sevenfold to tenfold) multiple, a high-efficiency power range is enabled to be widened. However, the carrier amplifier can be possibly destroyed if an input to a small transistor of the carrier amplifier becomes too large. According to this embodiment, it becomes possible to prevent the input from becoming too large by clipping the input to the carrier amplifier. Namely, the carrier amplifier and the peak amplifier are configured so that the carrier amplifier operates if the input is small and the peak amplifier operates if the input becomes large. If the ratio of the magnitude of the output power of the carrier amplifier to that of the peak amplifier is set to a large value, a width obtained by synthesizing the magnitude of input power for the carrier amplifier and that of input power for the peak amplifier becomes wide, whereby a dynamic range is widened.

The carrier amplifier 12 is a small amplifier that outputs low power, whereas the peak amplifier 13 is a large amplifier that outputs high power. These amplifiers are connected in parallel. A λ/4 delay line 10 is provided on an input side of the peak amplifier 13, whereas a λ/4 delay line 11 is provided on an output side of the carrier amplifier 12. A clipping circuit 14 is provided on an input side of the carrier amplifier 12. The clipping circuit 14 is composed of diodes. If a voltage equal to or higher than a predetermined voltage is applied, a current flows and a voltage applied to the input side of the carrier amplifier 12 is decreased. The diodes are orientated in different directions and connected in parallel. An input signal is clipped if the amplitude of the signal becomes a large positive value and if the amplitude becomes a large negative value. To clip the input signal, the elements represented with a symbol of a diode are used. However, many elements having nonlinearity may be available.

Figure 1B:
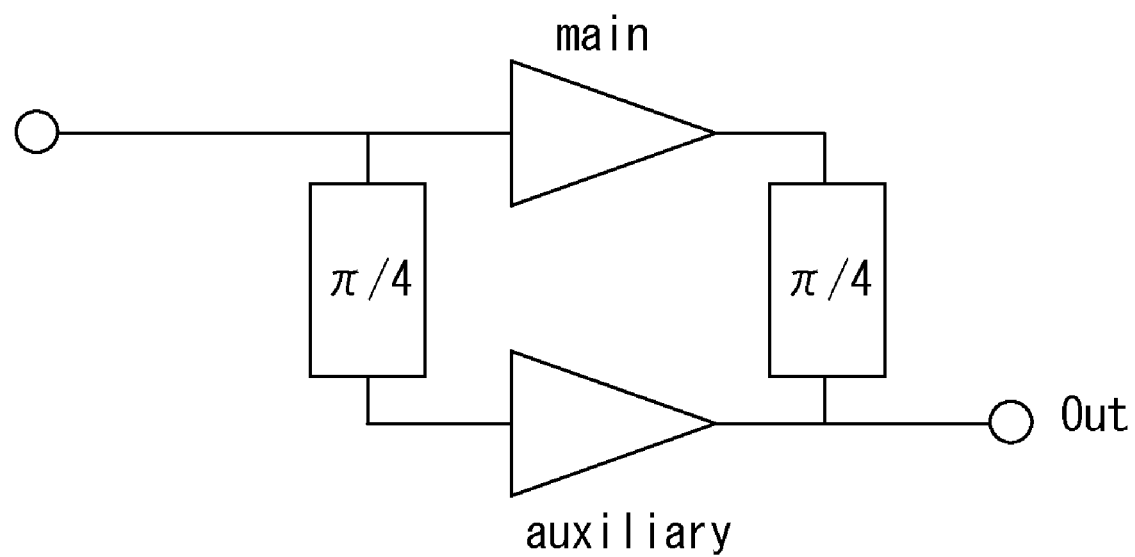
FIG. 1B is a circuit diagram (No. 2) illustrating a configuration of a representative power amplifier of a conventional technique.
Figure 1C:
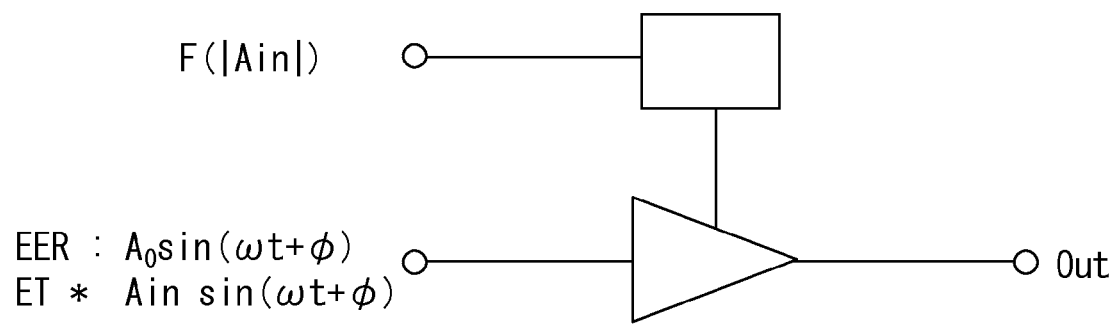
FIG. 1C is a circuit diagram (No. 3) illustrating a configuration of a representative power amplifier of a conventional technique.
Figure 3:
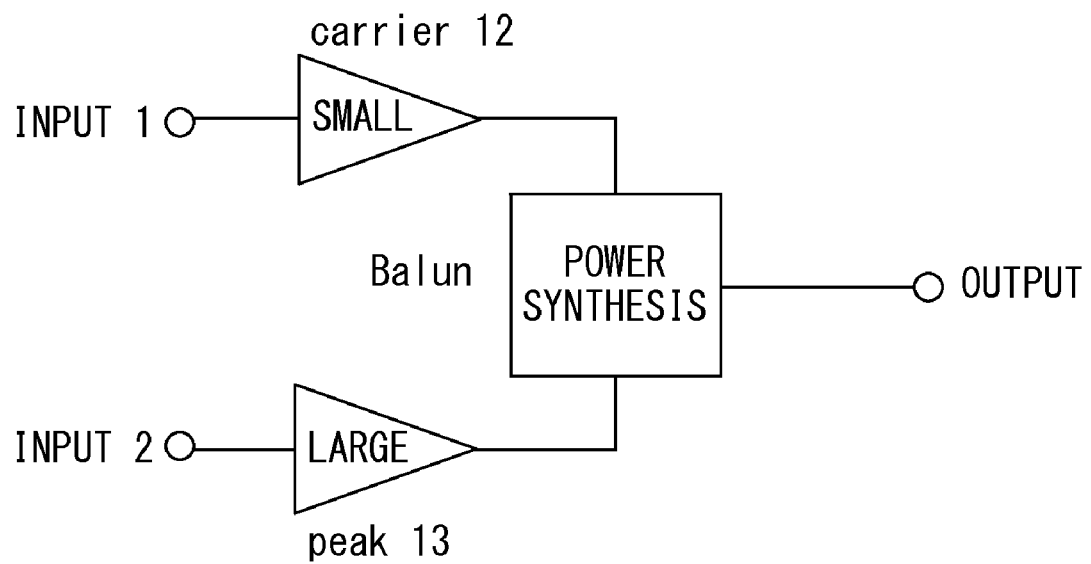
FIG. 3 illustrates a synthesizing circuit using a balun.

FIG. 3 illustrates a synthesis circuit using a balun.

A Doherty circuit composed of the carrier amplifier 12 and the peak amplifier 13 is normally configured by providing impedance converters (λ/4 delay lines 10, 11) implemented with a transmission line on a mounting substrate, and the Doherty circuit has a certain area determined in accordance with the shape of the substrate (thickness, design method (coplarner/microstrip-line or the like), and a physical property (permittivity)). Therefore, an impedance occurs, which is especially problematic when used in a mobile terminal. Accordingly, it is preferable to synthesize output powers of the carrier amplifier 12 and the peak amplifier 13 by using a balun. In FIG. 3, a balun that is a power synthesizer, the carrier amplifier 12, and the peak amplifier 13 are illustrated. An input 1 to the carrier amplifier 12 and an input 2 to the peak amplifier 13 are obtained by branching the same signal in FIG. 2. However, these inputs may be signals that are separately generated and synchronized.

FIGS. 4 to 8 illustrate other embodiments.

Figure 4:
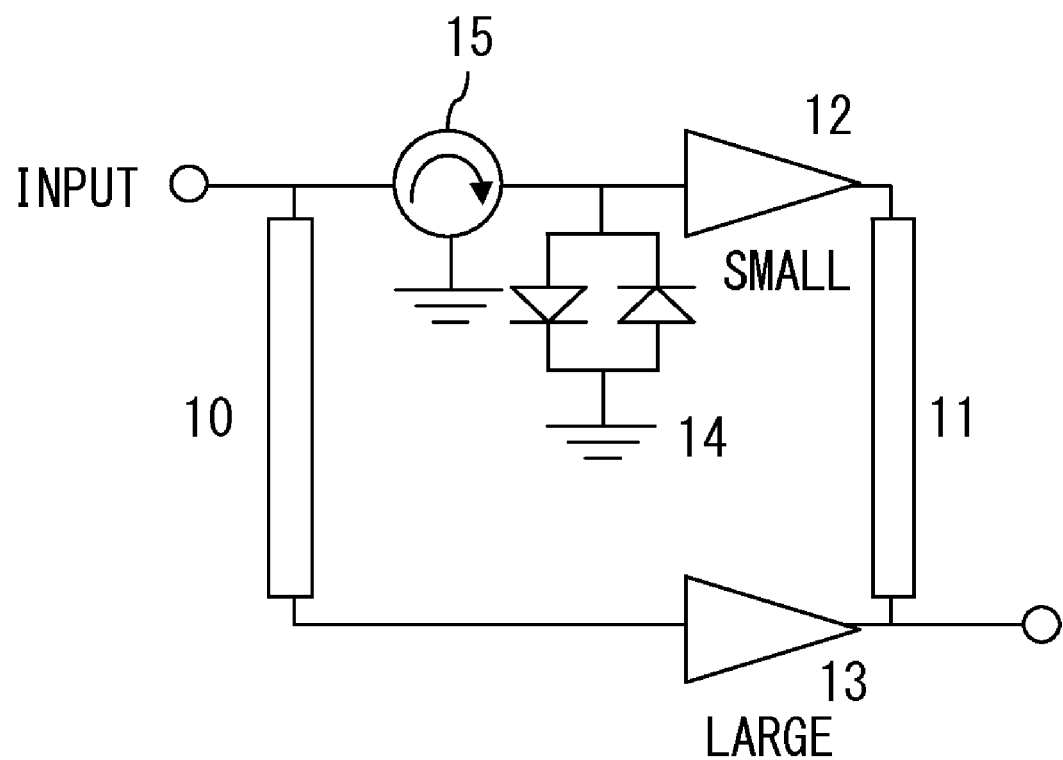
FIG. 4 illustrates another embodiment.

FIG. 4 illustrates an example of using an isolator 15 in order to prevent a reflected wave, caused when an input is significantly clipped, from returning to an input terminal. The isolator 15 is provided on an input side of the clipping circuit 14. If the clipping circuit 14 significantly clips an input, because the clipping circuit 14 itself functions as a capacitance, a reflected wave occurs. The isolator 15 makes the reflected wave flow to ground. The reflected wave is propagated with a phase difference to the input, thereby making it possible to prevent the entire circuit from being affected.

Figure 5A:
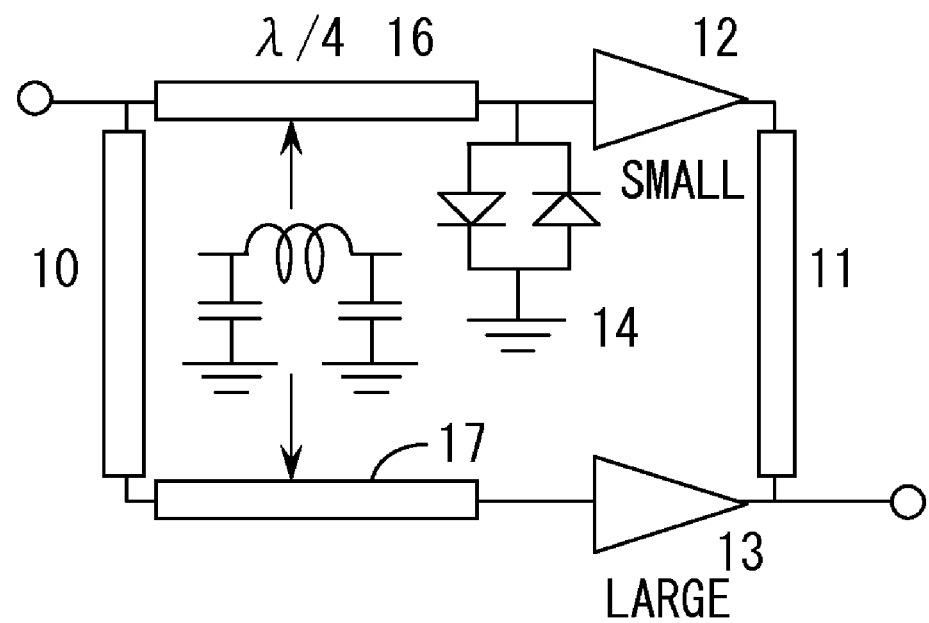
FIG. 5A is a circuit diagram (No. 1) illustrating a further embodiment.

FIG. 5A illustrates an example where a line 16 having an electric length of λ/4 is used as a replacement for the isolator, and an equivalent line is provided on the input side of the peak amplifier 13. The line having a length of λ/4 may be replaced with a clustered element (an impedance conversion circuit composed of a capacitance and an inductance. The wave reflected by the clipping circuit 14 passes the delay line 16 having a length of λ/4 when being input to the clipping circuit 14. Therefore, its phase is shifted from the input signal by λ/4. However, the wave again passes through the delay line 16 having a length of λ/4 when being reflected and returned in the input direction. Therefore, the phase changes by a total of λ/2, and the wave and the input cancel each other out. Namely, the reflected wave is not returned to the input side. The reason why the delay line 17 having a length of λ/4 is also provided on the input side of the peak amplifier 13 is to make the phases of the inputs of the peak amplifier 13 and the carrier amplifier 12 match.

Figure 5B:
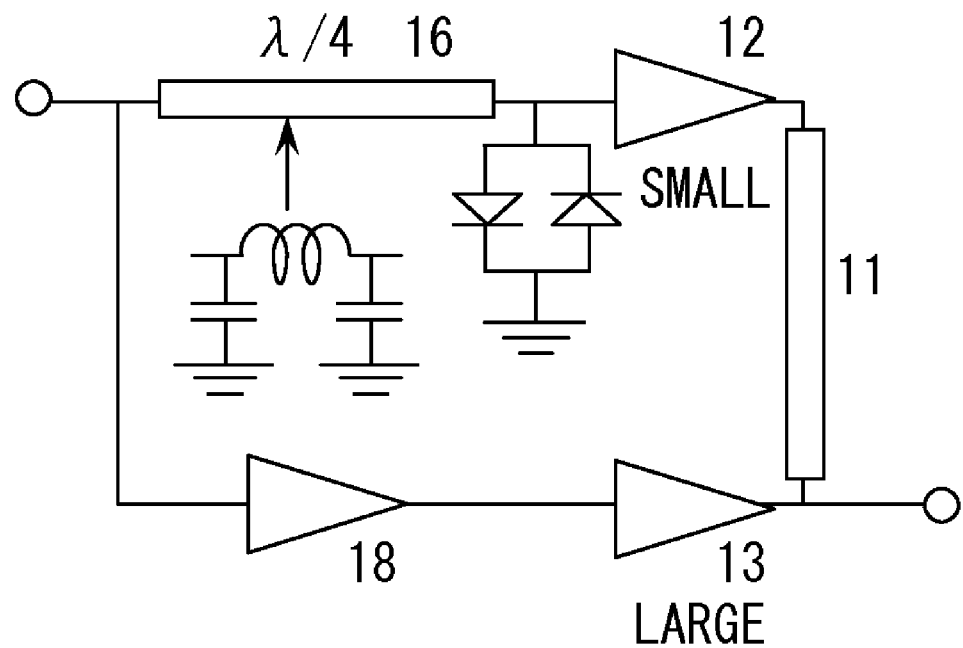
FIG. 5B is a circuit diagram (No. 2) illustrating a still further embodiment.

FIG. 5B illustrates a power amplifier configured by using an input delay line of the Doherty circuit which leads to the input of the peak amplifier 13, and a phase inversion circuit (impedance conversion circuit (shifting a phase by λ/2)) as a replacement for the delay line 17 added to the side of the peak amplifier 13 in FIG. 5A. A driver amplifier is available as this conversion circuit.

Figure 6:
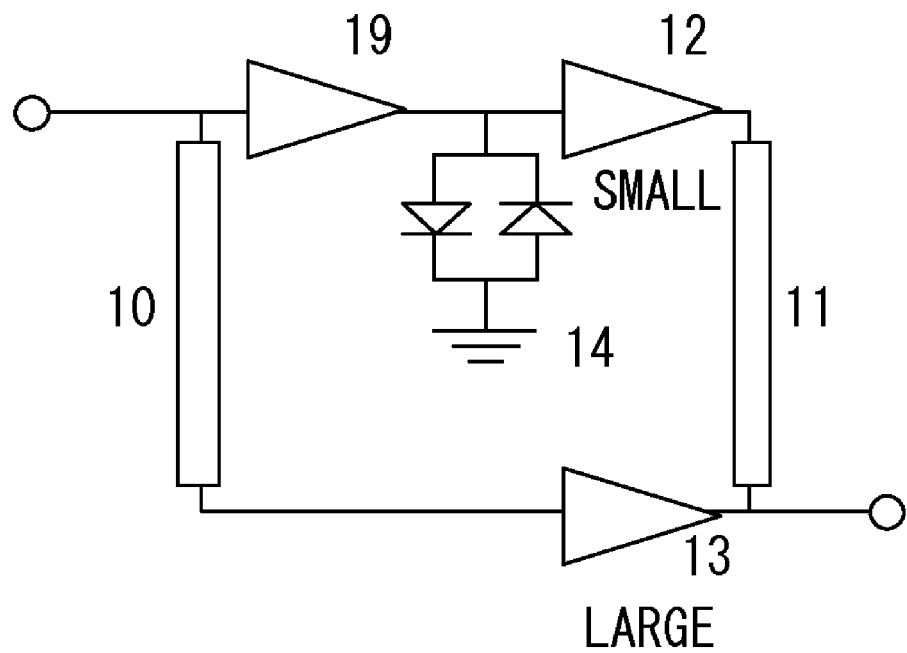
FIG. 6 is a circuit diagram (No. 3) illustrating a still further embodiment.

FIG. 6 illustrates an example of using an amplifier 19 as a replacement for the isolator 15. The amplifier 19 produces an effect of improving the isolation of a signal. Therefore, the amplifier 19 is available as a replacement for the isolator 15.

FIG. 7 illustrates an example of using an amplifier 21 in order to compensate for a gain on the side of the peak amplifier. Namely, in the configuration of FIG. 6, in which the amplifier 19 is provided on the input side of the carrier amplifier 12, an amplification rate on the side of the carrier amplifier 12 becomes imbalanced with the side of the peak amplifier 13. Therefore, the amplifier 21 is provided also on the side of the peak amplifier 13.

FIG. 8 illustrates an example where clipping is performed due to the nonlinearity (an operation varies depending on an amplitude of an input signal when impedance is adjusted) of a pre-amplifier 22 of the carrier amplifier 12.

FIGS. 9 to 12 are schematics for explaining operations of the configuration illustrated in FIG. 8.

In the example illustrated in FIG. 9, the carrier amplifier is prevented from being destroyed by overpower (overvoltage/overcurrent) by using an input circuit of the amplifier. In this figure, "C" and "P" represent the carrier amplifier and the peak amplifier, respectively. Capacitors c1 and c2 are respectively provided on the input sides of the carrier amplifier and the peak amplifier, whereas inductors le11 and le21 and capacitors ce11 and ce21 are provided on the output sides. Moreover, a delay line having a length of λ/4 on the input side of the peak amplifier, and a delay line having a length of λ/4 on the output side of the carrier amplifier are assumed to be 35Ω and 30Ω, respectively. The capacitors c1 and c2 are DC blocks, whereas ce11, ce2, le11, and le21 are load circuits.

Figure 10C:
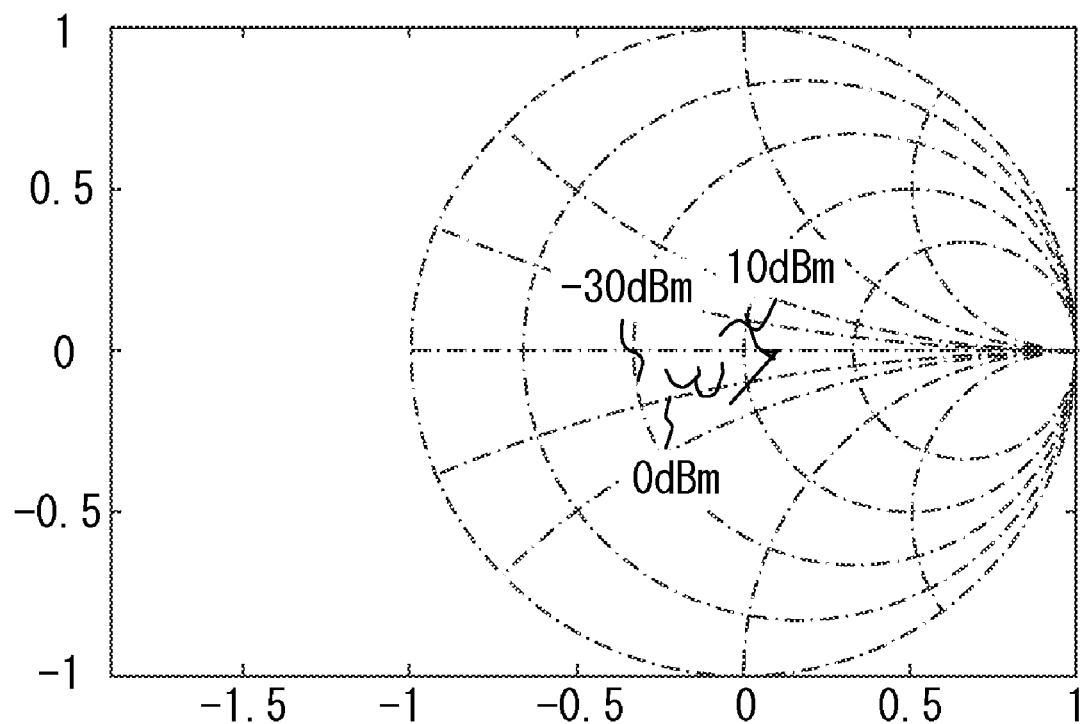
FIG. 10C is a schematic (No. 4) for explaining the operations of the configuration illustrated in FIG. 8.

To explain further details, FIGS. 10A to 10C illustrate an impedance (this characteristic can be obtained with a simple matching circuit) when the amplifier side is viewed from the parts on the signal input path. FIG. 10A illustrates an input impedance of the carrier amplifier. FIG. 10B illustrates an input impedance of the peak amplifier. FIG. 10C illustrates an input impedance obtained by synthesizing the input impedance of the carrier amplifier and that of the peak amplifier.

Smith charts illustrated in FIGS. 10A to 10C respectively represent the impedances when input power is −30 dBm, 0 dBm, and 10 dBm respectively, and illustrate a characteristic of 2.3 to 2.7 GHz (clockwise).

As illustrated in FIG. 10A, the input impedance of the carrier amplifier is approximately 50Ω when the input power is low, and a signal is efficiently input to the carrier amplifier from a signal source of 50Ω. An input impedance increases with an increase in the power of an input signal. As a result, a ratio of the power of the signal invading into the input path of the carrier amplifier is reduced. Accordingly, the power amplifier is designed so that the input impedance of the carrier amplifier is approximately set to the impedance of the signal source and the input impedance of the carrier amplifier becomes higher than that of the signal power as the input power increases.

In the meantime, it is possible to adjust the impedance of the path, which is applied to the side of the peak amplifier, to approximately 50Ω, which is equal to the impedance of the signal source regardless of the power of the signal as illustrated in FIG. 10B. Accordingly, a smooth rise is realized despite being biased in a class C by efficiently supplying the input signal to the peak amplifier.

FIG. 10C illustrates an example of a synthesized impedance of the input of the Doherty amplifier. The impedance is the lowest if the input power is −30 dBm. As the input increases through the range of 0 dBm to 10 dBm, the impedance also increases. This is mainly due to the input impedance of the carrier amplifier.

As described above, the ratio of the power of the signal invading into the carrier amplifier is reduced if the power of the signal increases. As a result, the carrier amplifier is prevented from being destroyed, and extra power of the signal is directed to the peak amplifier, whereby a high power-added efficiency $ (P_{out}-P_{in})$/power consumption is enabled to be achieved.

Figure 11:
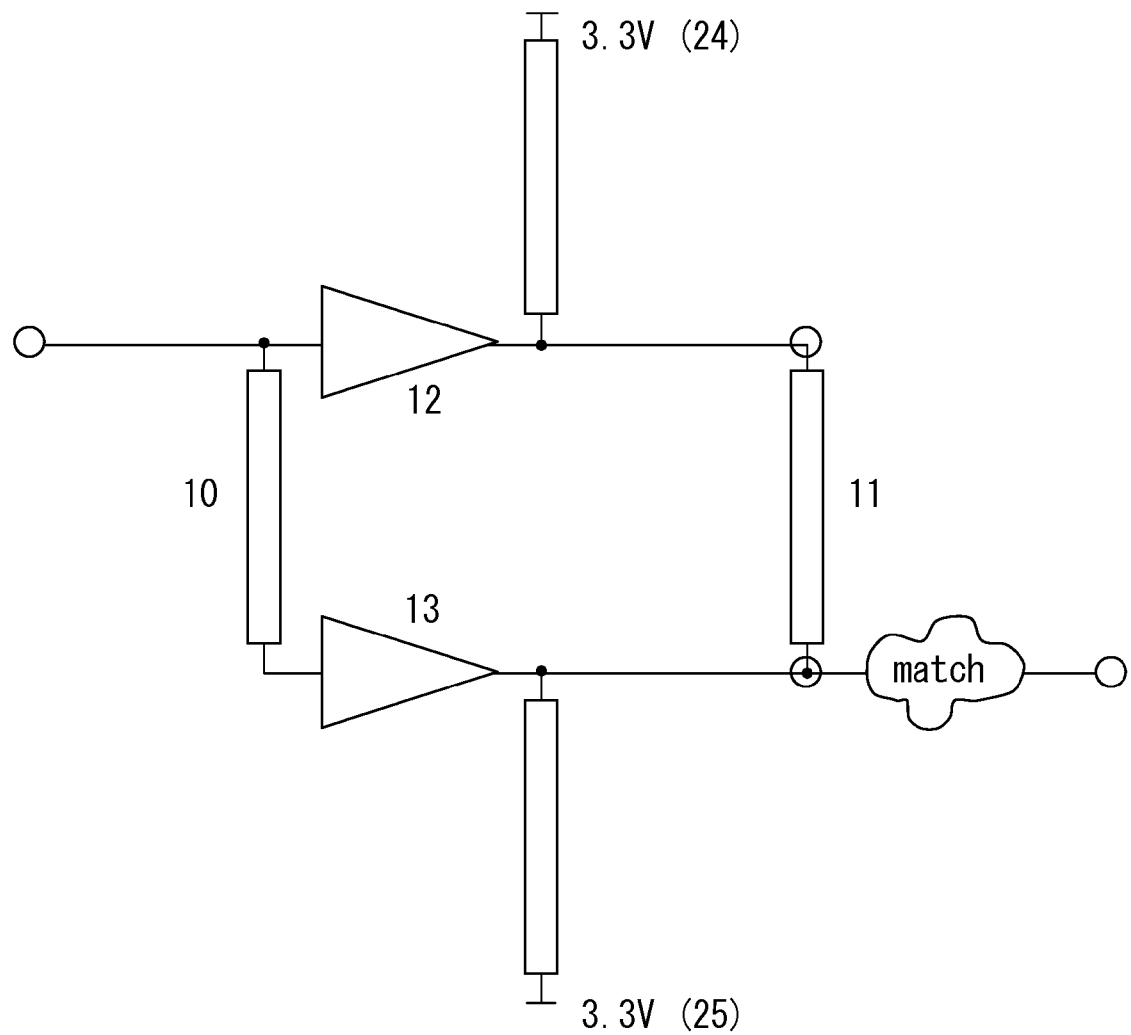
FIG. 11 is a schematic (No. 5) for explaining the operations of the configuration illustrated in FIG. 8.

Assume that a Doherty amplifier is configured as illustrated in FIG. 11. Namely, the carrier amplifier 12 and the peak amplifier 13 are connected in parallel, and the λ/4 delay lines 10 and 11 are provided on the input side of the peak amplifier 13 and the output side of the carrier amplifier 12, respectively. Power sources 24 and 25 supply a direct current component to an alternating current signal component respectively output from the amplifiers.

In FIG. 12, (1) and (2) represent an impedance on the input side of the carrier amplifier and that on the input side of the peak amplifier, respectively. An arrow within the Smith chart of FIG. 12 represents an impedance at an entry portion of the delay line Z0 on the input side of the peak amplifier. "Low", "mid", and "high" respectively represent impedances when the amplitude of a signal is small, medium, and large. If the amplitude of the signal is small, the impedance on the input side of the carrier amplifier is low and the impedance on the side of the peak amplifier is high. Therefore, the signal is mainly input to the carrier amplifier. If the amplitude of the signal increases, the input impedance of the carrier amplifier increases and that of the peak amplifier decreases. Therefore, the signal is mainly input to the peak amplifier. As described above, it becomes possible to switch the flow of the signal by adjusting the impedances.

The above described embodiments enable the power amplifier to be operated at high efficiency in a wide power range on the side of the large amplifier while the ratio of the sizes of elements is set to between 7 and 10, and makes it possible to prevent an input to the carrier amplifier from becoming too large. As a result, it becomes possible to reduce the power, the size, the cost, and the operating cost of the power amplifier, and to enhance its reliability when being used in a base station (BS) and a mobile station (MS). In addition, the lifetime of a battery can be increased and its weight can be lightened when being used in the MS.

Namely, according to the above described embodiments, a microwave to milliwave broadband power amplifier which consumes less power and has a high power supply efficiency characteristic is provided. In particular, if this power amplifier is used for a mobile terminal, a device that enables necessary RF power to be output for a long time by using a small lightweight battery is realized. If the embodiments are applied to a fixed station or a base station, less power consumption and less heat generation are achieved. This contributes to improvements in the downsizing, the lifetime and the convenience of a device, and to the enhancement of reliability of the device as well.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A power amplifier of a Doherty type, comprising:
   a peak amplifier;
   a carrier amplifier that is coupled in parallel to the peak amplifier, and outputs a lower power than the peak amplifier; and
   a clipping circuit that is provided on an input side of the carrier amplifier and is configured to clip an input signal if an amplitude of the input signal to the carrier amplifier is equal to or larger than a predetermined value.

2. The power amplifier according to claim 1, wherein the clipping circuit is configured by coupling, in parallel, diodes oriented in different directions.

3. The power amplifier according to claim 1, further comprising
an isolator at a stage preceding the clipping circuit on the input side of the carrier amplifier.

4. The power amplifier according to claim 1, further comprising a $\lambda/4$ delay line configured to delay a phase of a signal by $\lambda/4$ at a stage preceding the clipping circuit on the input side of the carrier amplifier.

5. The power amplifier according to claim 4, further comprising a second $\lambda/4$ delay line configured to delay a phase of a signal by $\lambda/4$ on an input side of the peak amplifier.

6. The power amplifier according to claim 4, further comprising
a driver amplifier on an input side of the peak amplifier as a replacement for the delay line provided in a power amplifier on a Doherty side.

7. The power amplifier according to claim 1, further comprising
an amplifier at a stage preceding the clipping circuit on an input side of the peak amplifier.

8. The power amplifier according to claim 7, further comprising
an amplifier on the input side of the carrier amplifier.

9. The power amplifier according to claim 1, wherein
a balun is used to synthesize outputs of the peak amplifier and the carrier amplifier.

10. A power amplifier of a Doherty type, comprising:
a carrier amplifier an input impedance of which is equal to an impedance of a signal source if an amplitude of a signal is small, and the impedance of which increases with an increase in the amplitude of the signal;
a peak amplifier an input impedance of which is equal to an impedance of a signal source, and which is coupled in parallel to the carrier amplifier; and
a clipping circuit that is provided on an input side of the carrier amplifier and is configured to clip an input signal if an amplitude of the input signal to the carrier amplifier is equal to or larger than a predetermined value.

11. A power amplifier of a Doherty type, comprising:
a first amplifier;
a second amplifier that is coupled in parallel to the first amplifier, and outputs a lower power than the first amplifier;
a clipping circuit that is provided on an input side of the second amplifier and is configured to clip an input signal if an amplitude of the input signal to the second amplifier is equal to or larger than a predetermined value; and
an isolator at a stage preceding the clipping circuit on the input side of the second amplifier.

12. A power amplifier of a Doherty type, comprising:
a first amplifier;
a second amplifier that is coupled in parallel to the peak amplifier, and outputs a lower power than the first amplifier;
a clipping circuit that is provided on an input side of the second amplifier and is configured to clip an input signal if an amplitude of the input signal to the second amplifier is equal to or larger than a predetermined value;
a $\lambda/4$ delay line configured to delay a phase of a signal by $\lambda/4$ at a stage preceding the clipping circuit on the input side of the second amplifier; and
a second $\lambda/4$ delay line configured to delay a phase of a signal by $\lambda/4$ on an input side of the first amplifier.

* * * * *